(12) United States Patent
Murrell et al.

(10) Patent No.: US 7,611,975 B2
(45) Date of Patent: Nov. 3, 2009

(54) METHOD OF IMPLANTING A SUBSTRATE AND AN ION IMPLANTER FOR PERFORMING THE METHOD

(75) Inventors: Adrian Murrell, West Sussex (GB); Peter Michael Banks, West Sussex (GB); Matthew Peter Dobson, East Sussex (GB); Peter Kindersley, West Sussex (GB); Takao Sakase, Rowley, MA (US); Marvin Farley, Ipswich, MA (US); Shu Satoh, Byfield, MA (US); Geoffrey Ryding, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/527,594

(22) Filed: Sep. 27, 2006

(65) Prior Publication Data

US 2007/0105355 A1 May 10, 2007

Related U.S. Application Data

(60) Continuation-in-part of application No. 11/417,028, filed on May 4, 2006, now Pat. No. 7,282,427, which is a division of application No. 10/754,502, filed on Jan. 12, 2004, now Pat. No. 7,049,210, which is a continuation-in-part of application No. 10/251,780, filed on Sep. 23, 2002, now Pat. No. 6,908,836.

(51) Int. Cl.
*H01L 21/12* (2006.01)
*H01L 21/20* (2006.01)
*H01J 37/304* (2006.01)
*H01J 37/317* (2006.01)

(52) U.S. Cl. .................. 438/506; 438/373; 438/407; 438/440; 438/527; 438/961; 257/E21.001; 257/E21.092; 257/E21.214; 250/492.2; 250/492.21; 250/497.1

(58) Field of Classification Search ................. 438/373, 438/506, 535; 250/492.2, 492.21
See application file for complete search history.

(56) References Cited

U.S. PATENT DOCUMENTS 6,268,609 B1 * 7/2001 Ryding et al. .......... 250/492.21
6,297,510 B1 * 10/2001 Farley ................... 250/492.21
2001/0032937 A1 * 10/2001 Berrian .................... 250/492.2

* cited by examiner

*Primary Examiner*—Dao H Nguyen
(74) *Attorney, Agent, or Firm*—Boult Wade Tennant; Birch Stewart Kolasch & Birch

(57) ABSTRACT

An implanter provides two-dimensional scanning of a substrate relative to an implant beam so that the beam draws a raster of scan lines on the substrate. The beam current is measured at turnaround points off the substrate and the current value is used to control the subsequent fast scan speed so as to compensate for the effect of any variation in beam current on dose uniformity in the slow scan direction. The scanning may produce a raster of non-intersecting uniformly spaced parallel scan lines and the spacing between the lines is selected to ensure appropriate dose uniformity.

9 Claims, 9 Drawing Sheets

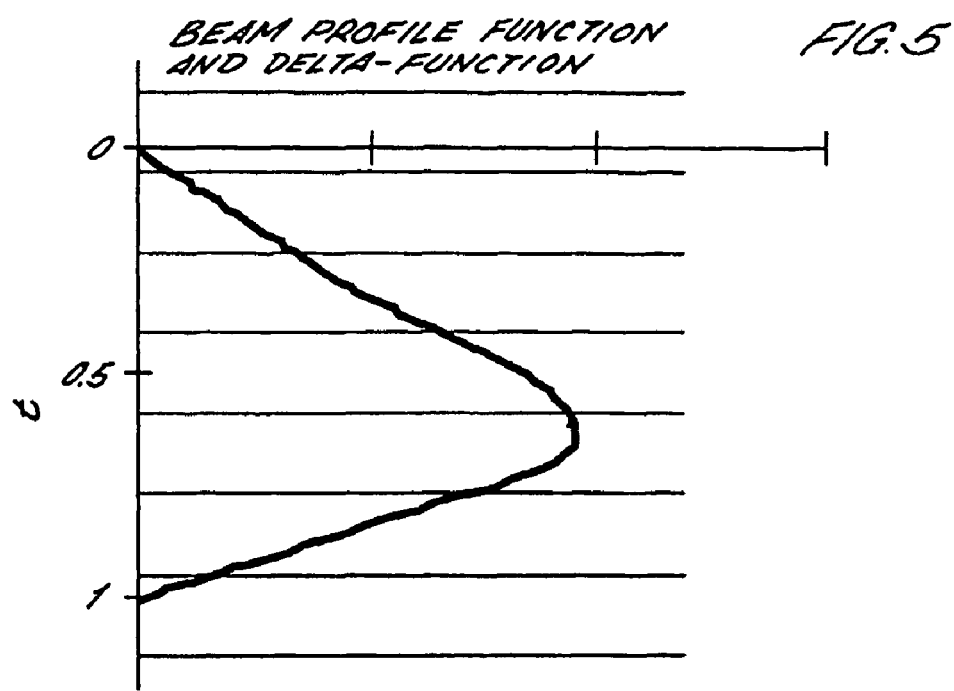
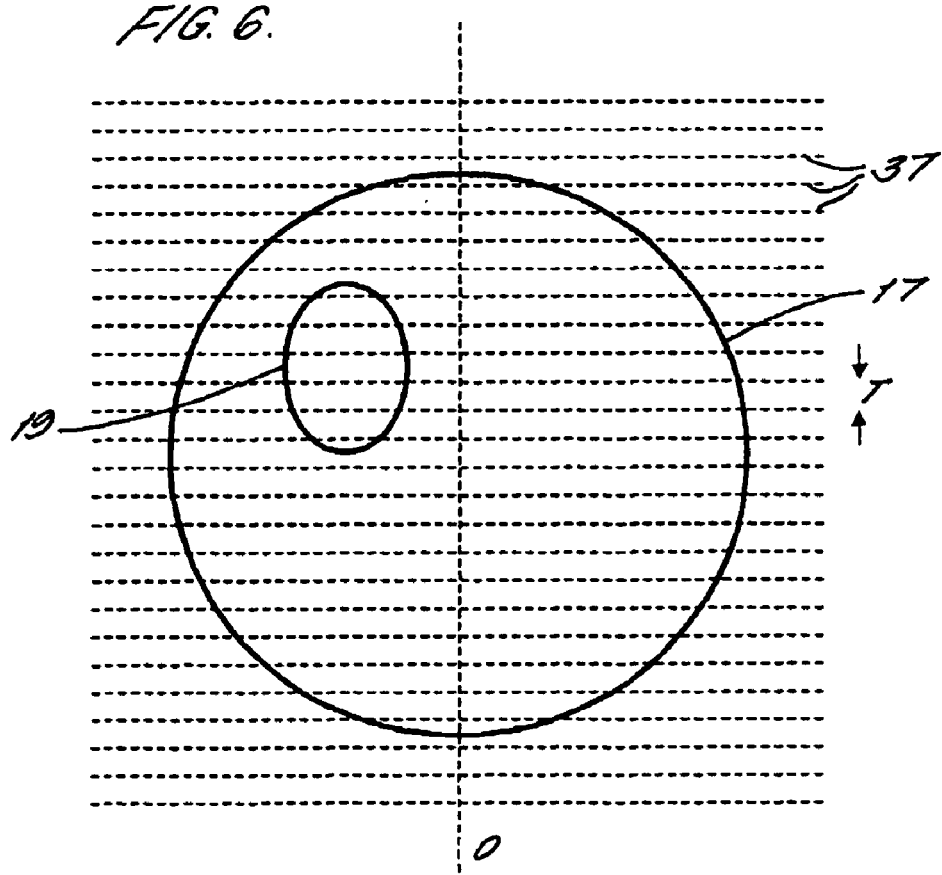

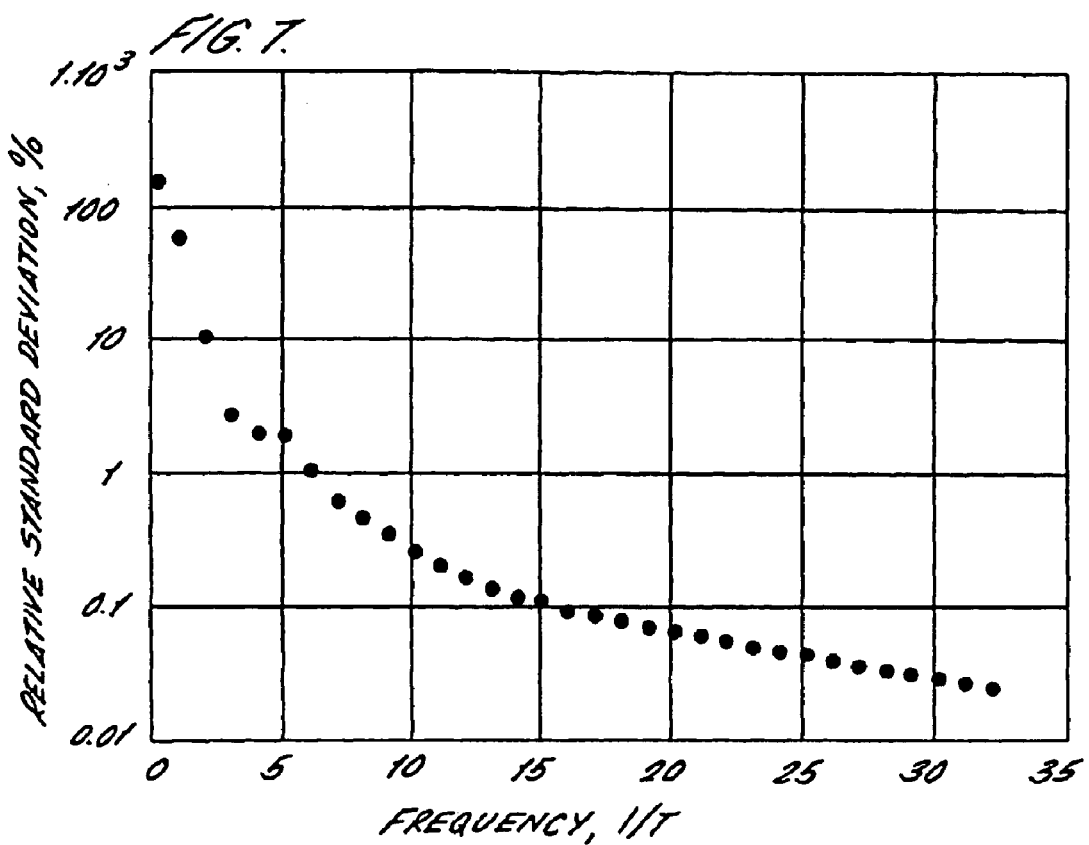
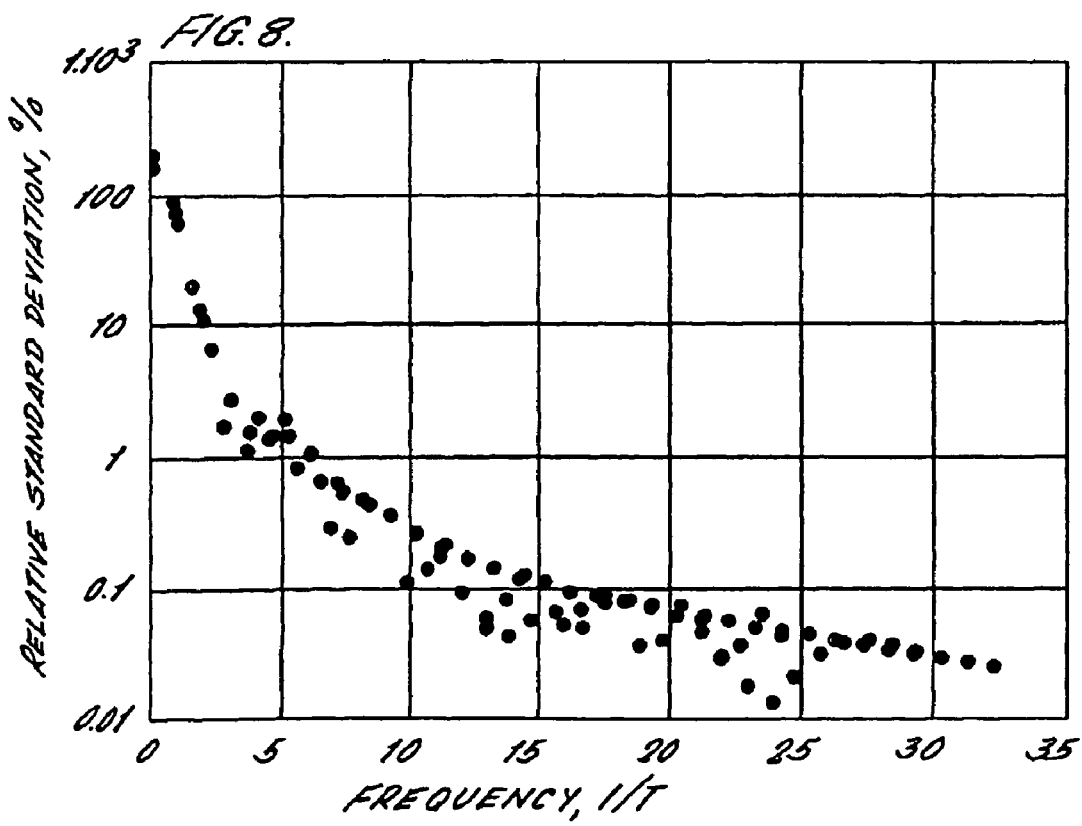

ial movement of the wafer is ensured by controlling the rate of this mechanical movement, but the rate of mechanical movement is always much slower than the beam scanning rate.

METHOD OF IMPLANTING A SUBSTRATE AND AN ION IMPLANTER FOR PERFORMING THE METHOD

CROSS-REFERENCE TO RELATED APPLICATIONS

This application is a Continuation-In-Part of copending application Ser. No. 11/417,028, filed on May 4, 2006, and for which priority is claimed under 35 U.S.C. § 120, which is a Continuation of application Ser. No. 10/754,502, filed on Jan. 12, 2004, (now U.S. Pat. No. 7,049,210 dated 23 May 2006) which is a Continuation-In-Part of application Ser. No. 10/251,780, filed on Sep. 23, 2002 (now U.S. Pat. No. 6,908,836 dated Jun. 21, 2005), and for each of which priority is also claimed under 35 U.S.C. § 120. The entire contents of these applications are hereby incorporated by reference.

FIELD OF THE INVENTION

This invention relates to a method of implanting a substrate in which the relative movement between the substrate and an implant beam is controlled to maintain a desired and uniform dose of implanted species over the surface of the substrate. The invention also relates to ion implanters adapted for performing the method.

BACKGROUND OF THE INVENTION

In a typical ion implanter, a relatively small cross-section beam of ions containing a desired atomic species is scanned relative to a substrate to be implanted, typically a semi-conductor wafer.

The beam may be scanned transversely in two dimensions relative to the stationary wafer, or the wafer may be scanned in two dimensions relative to a stationary beam. There are also hybrid scanning techniques when the beam is scanned in one dimension whilst the wafer is mechanically scanned in a second typically orthogonal direction.

The various techniques have advantages and disadvantages. For batch processing of semi-conductor wafers, the wafers of a batch can be mounted on a rotating wheel and the axis of rotation of the wheel can then be scanned to and fro to provide two-dimensional mechanical scanning of the wafers across a stationary beam. An example of batch implanter of this kind is described in U.S. Pat. No. 5,389,793.

Single wafer implanters can employ the hybrid mechanical and electrostatic or electromagnetic beam scanning outlined above. Such an arrangement is described in our commonly assigned U.S. Pat. No. 5,898,179. Here, the ion beam is electromagnetically scanned in a first direction perpendicular to the beam axis in the ion implanter, whilst the wafer is mechanically moved in a second generally orthogonal direction.

It is important in implanting to ensure that the total dose of desired species implanted into the semi-conductor wafer or other substrate has the desired level of dose uniformity over the entire substrate surface. In the above-described batch-type of implanters, this is achieved by spinning the implant wheel at high speed and scanning the wheel axis to and fro so that the wafers mounted on the wheel pass across the beam many times during an implant process. In the hybrid single-wafer implanters also mentioned above, dose uniformity is maintained by performing the electrostatic or electromagnetic beam scanning at a relatively high rate compared to the mechanical movement of the wafer to be implanted. Dose uniformity over the wafer surface in the direction of mechanical movement of the wafer is ensured by controlling the rate of this mechanical movement, but the rate of mechanical movement is always much slower than the beam scanning rate.

SUMMARY OF THE INVENTION

It is an object of embodiments of this invention to provide novel scanning algorithms which can provide particular advantages as will be apparent from the following.

The invention provides a method of implanting a substrate wafer having an implant surface with a predetermined diameter, the method comprising:

a) generating an implant beam having a predetermined beam direction, b) holding said substrate wafer aligned in an implant plane, normal to said beam direction, c) said beam having orthogonal cross-sectional dimensions in said implant plane each of which is less than said predetermined wafer diameter, and d) mechanically scanning said substrate wafer in two dimensions in said implant plane to provide a desired uniform total implant dose over the implant surface of the substrate wafer, wherein said mechanical scanning is performed so as to deliver said total implant dose in first and second parts, said first part being delivered by performing said mechanical scanning with said substrate wafer held in a first orientation about a twist axis parallel to said predetermined beam direction, and said second part being delivered to complete said total implant dose by performing said mechanical scanning with the substrate wafer held in a second orientation at 180° to said first orientation about said twist axis.

By dividing the total implant dose into two parts a first delivered with the wafer twisted by 180° relative to a second, a "dual" implant is obtained which can provide the advantages of a known multi-orientation (quad) implant, especially for zero angle implants using a fully mechanical (2-D) scanning implanter.

The invention also provides a method of implanting a substrate wafer having an implant surface with a predetermined diameter, the method comprising:

a) generating an implant beam having a predetermined beam direction, b) holding said substrate wafer aligned in an implant plane, normal to said beam direction, c) said beam having orthogonal cross-sectional dimensions in said implant plane each of which is less than said predetermined wafer diameter, and d) mechanically scanning said substrate wafer in two dimensions in said implant plane to provide a desired uniform total implant dose over the implant surface of the substrate wafer, wherein the substrate wafer is mechanically scanned so that the implant beam draws on the implant surface of the substrate wafer alternating first and second rasters of scan lines, each of said first and second rasters covering the whole of said implant surface, said first rasters are drawn with said substrate wafer held in a first orientation about a twist axis parallel to said predetermined beam direction, and said second rasters are drawn with the substrate wafer held in a second orientation at 180° to said first orientation about said twist axis. By ensuring the substrate wafer is twisted by 180° between each 2-D mechanical scan pass (or raster), thermal loading of the wafer during implanting can be made more uniform.

The invention further provides a method of implanting a substrate, comprising a) generating an implant beam having a measurable flux of a desired atomic species and b) producing relative movement between the substrate and the beam both (i) in a first direction transverse to the beam direction to produce at least one pass of the beam over the substrate and (ii) in a second direction transverse to the beam direction and said first direction to produce a plurality of scans of the beam over the substrate during each said pass, whereby said scans draw on the substrate a raster of lines having mid-points which have predetermined spacing in said first direction. The scans are arranged to extend beyond an edge of the substrate to positions at which no beam flux is absorbed by the substrate. The beam flux is measured at these positions and the speed of the next said scan over the substrate is adjusted in response to the previously-measured beam flux. The speed adjustment may be sufficient to compensate fully for beam current changes during the pass, so that the adjustment maintains a desired rate of implanting in the substrate of said atomic species per unit length of the scan over the substrate. However the speed adjustment may compensate only partly, and other adjustments may be made as well, such as to the spacing between line mid-points and/or to the beam current itself.

In this method, the movement in the first direction can be called a slow scan between the beam and the substrate and the movement in the second direction can be called a fast scan. Preferably, the slow scan movement is maintained to ensure the raster lines drawn on the substrate by the fast scans have mid-points which are uniformly spaced. The amount of dose per unit length delivered by each of the fast scans is then controlled from scan to scan in accordance with the measured beam flux by adjusting the speed of the fast scans.

The invention may be employed using a continuous relative movement between beam and substrate in the slow scan direction, producing a zig-zag or saw-tooth scan pattern on the substrate. However, better results are obtained if the scans draw a raster of non-intersecting uniformly spaced substantially parallel lines on the substrate.

Good dose uniformity over the substrate can then be obtained, even for a single pass of the beam over the substrate in said first direction.

Importantly also, good dose uniformity is possible even if the fast scans of the beam in said second direction are themselves relatively slow compared to the scanning rates achievable with electromagnetic/electrostatic beam scanning systems. As a result, the method has particular application in single wafer mechanical scanning systems where the fast scanning of the wafer relative to the beam is achieved by a reciprocating mechanical movement of the wafer on a wafer holder. With reciprocating mechanical scanning systems, the highest rate at which the wafer can be reciprocated across the implant beam is limited. As a result, with an implant beam having a predetermined flux of the desired atomic species to be implanted, the amount of dose delivered to each unit area of the substrate in the scan path, as the beam makes a single traverse over that area, is much higher. Therefore, the spacing between successive fast scans, and in particular the spacing between the lines of the raster formed by the scanning system, tends to be greater.

Controlling the speed of each fast scan in such a scanning system, in accordance with the beam flux measured just before the scan, ensures that each fast scan delivers dose to the wafer at the same rate per unit length of the scan so that the uniformly spaced scans deliver a uniform dose over the slow scan.

Preferably, said relative movement between the substrate and the beam in said second direction is produced by mechanically scanning the substrate parallel to said second direction, and said relative movement in said first direction is produced by mechanically translating said substrate parallel to said first direction by a uniform distance between scans.

The invention also provides a method of implanting a substrate comprising the steps of a) generating an implant beam having a predetermined beam flux of a desired atomic species, b) mechanically translating the substrate parallel to a first direction transverse to the beam direction to produce at least one pass of the beam over the substrate, c) mechanically reciprocating the substrate parallel to a second direction, transverse to the beam direction and said first direction, to produce a plurality of scans of the beam over the substrate during each said pass, whereby said scans draw on the substrate a raster of lines having mid-points which have predetermined spacing in said first direction, and d) controlling said mechanical translating step to select said spacing of said mid-points of the raster lines so that said raster provides a desired uniformity, in said first direction, of implanted dose of said atomic species over the substrate.

A two-dimensional mechanical scanning procedure of this kind enables wafers to be implanted singly (i.e. not in a batch process) using a relatively simple beam line without the beam scanning systems employed in hybrid scanning single-wafer implanters such as those discussed above. Because reciprocating mechanical scanning of a wafer is likely to be relatively slow compared to electrical beam scanning, relatively few scans of the beam over the substrate are required to deliver to the substrate the dose of required atomic species specified by the process recipe. This implies that the individual lines of the raster produced by the scanning process may be spaced apart by a significant fraction of the width of the ion beam. Also the complete implant may require only a small number of passes of the beam over the substrate (in the above-mentioned first direction transverse to the mechanical reciprocation direction, the second direction).

The method of the invention set out above ensures that the spacing of the raster lines is nevertheless such as to provide the desired dose uniformity over the substrate. Again, best results are obtained if the scans draw a raster of non-intersecting uniformly spaced substantially parallel lines in the substrate, which can be achieved by employing a plurality of translation steps in said first direction between respective pairs of successive scans.

The controlling step set out above may include measuring the cross-sectional profile of the ion beam at least in said first direction, calculating from said profile a maximum value of said spacing of said mid-points which provides said desired uniformity, and adjusting the mechanical translating step to select a value of said spacing which does not exceed said maximum value.

Techniques for calculating from the measured profile the maximum value of raster line spacing to provide the desired uniformity will be explained in greater detail in the following description of examples of this invention.

Alternatively, or additionally, the controlling step may include measuring the cross-sectional profile as above, calculating a desired value of said uniform raster line spacing from data including said beam flux, the speed of said mechanical reciprocation and the desired dose per unit area of substrate to be implanted, then using said measured cross-sectional profile of the ion beam to calculate the dose uniformity which would be obtained at the calculated desired spacing value, and selecting said desired spacing value as the uniform spacing to be employed, only if said calculated uniformity is not worse than said desired uniformity.

It will be understood that, given a predetermined beam flux of the desired atomic species, and a known rate of scanning, the raster line spacing needed to provide the implant recipe dose to the substrate using, for example, four passes of a substrate over the beam, can be calculated. However, this desired raster line spacing to achieve the desired recipe dose can be used for implanting only if it results in the desired dose uniformity. If the calculated uniformity is worse than the desired uniformity, the beam flux and consequently the line spacing can be reduced to a level at which the calculated dose uniformity is no longer worse than the desired uniformity. Alternatively, or as well, steps may be taken to improve the spatial blending quality of the measured beam profile, as will be explained later in greater detail.

In the summary above and the detailed description which follows, the term "raster" is used to denote a set of scan lines drawn by an ion beam on a substrate being implanted. The scan lines of a single raster may be drawn in a single pass of the beam over the wafer (in the slow scan direction), or may be drawn by two or more successive passes. It should also be noted that a single scan line of the raster could be drawn by multiple overlying scans of the beam over the substrate (in the fast scan direction).

BRIEF DESCRIPTION OF THE DRAWINGS

Examples of the invention will now be described with reference to the accompanying drawings, in which:

FIG. 5 is a graphical representation of an arbitrary ion beam intensity profile function in one dimension;

FIG. 6 is an illustration of a semi-conductor wafer to be implanted showing the scanning raster over the substrate, and illustrating an arbitrary beam shape;

FIG. 7 is a graphical representation of dose uniformity against the spatial frequency of the scanning raster lines on the substrate wafer, calculated by means of Fast Fourier Transform (FFT);

FIG. 8 is a similar graphical representation of dose uniformity against spatial frequency showing additional points plotted by using the scaling property of a Fourier transform;

DESCRIPTION OF THE PREFERRED EMBODIMENTS

Figure 1:
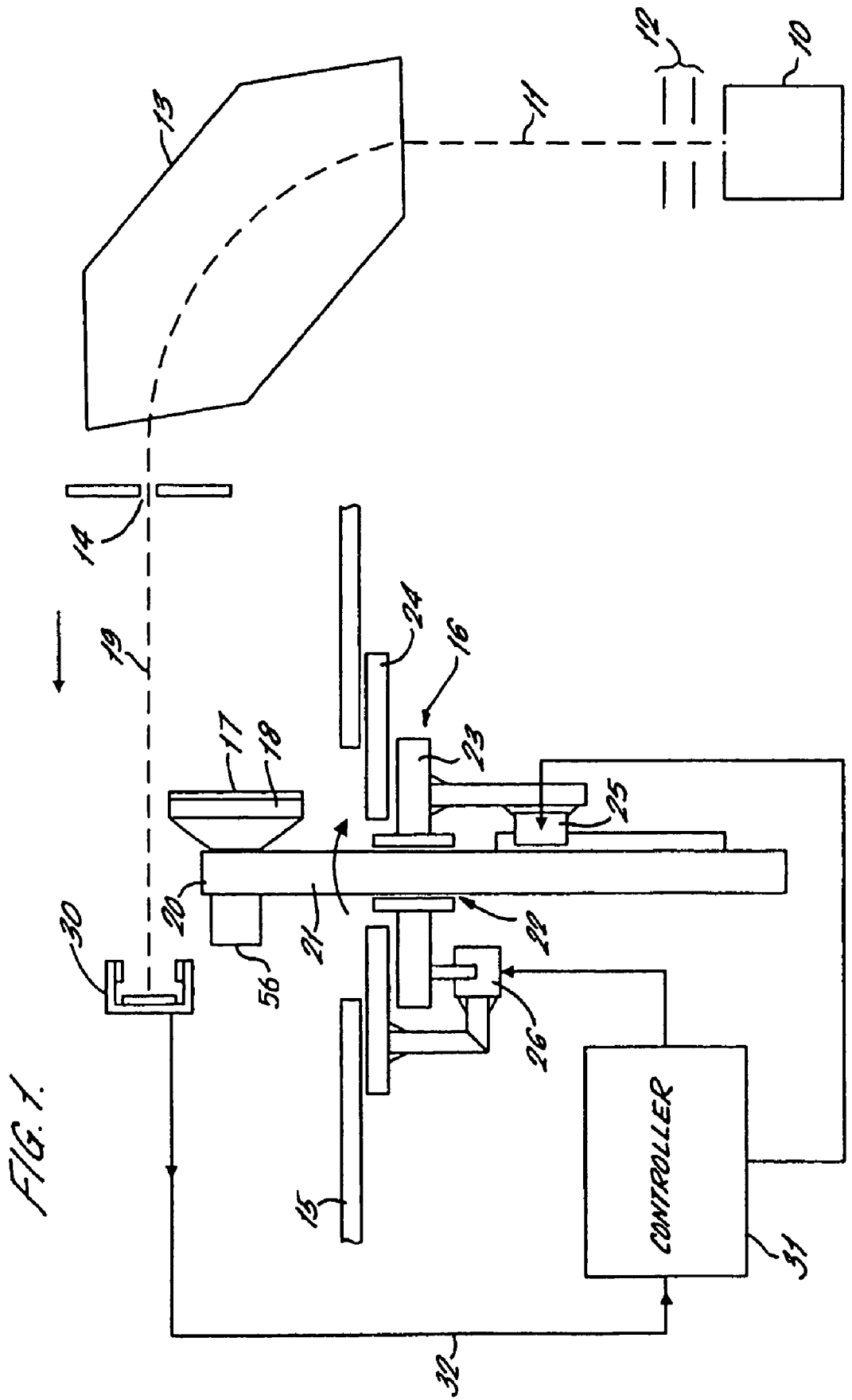
FIG. 1 is a schematic diagram of an ion implanter illustrating an embodiment of the present invention.

Referring to FIG. 1, the illustrated ion implanter comprises an ion source 10 from which a beam 11 of ions is extracted by means of extraction electrodes 12. The ion beam 11 then passes through a mass analyser magnet 13 and ions in the beam emerging from the mass analyser magnet 13 which have a desired mass, corresponding to ions containing the atomic species to be implanted, are selected from the beam by means of a mass resolving slit 14. As is well known, the beam ions selected for implantation may be atomic ions containing only the atomic species required to be implanted, molecular ions including the required atomic species, or cluster ions comprising multiple atoms of the desired species or multiple molecules.

These components of the ion implanter are standard and well known to workers in the field of ion implantation. Together these components form an ion-beam generator which generates a beam of ions containing a desired atomic species for implantation in a semi-conductor wafer.

The mass selected ion beam from the beam generator described above enters an evacuated process chamber having a chamber wall of which part is illustrated at 15. A wafer scanning arrangement illustrated generally at 16 is mounted on the wall 15 of the process chamber and is operable to scan a wafer 17 held on a wafer holder 18 in two directions transversely of the mass selected ion beam 19. The wafer holder 18 is mounted at a distal end 20 of a scan arm 21 which extends through a vacuum seal 22 from the interior to the exterior of the process chamber. The vacuum seal 22 is formed in a slide plate 23 which is mounted for linear movement transversely of the longitudinal axis of the scan arm 21, on a rotary carrier plate 24, which is in turn mounted for rotatable movement in a plane transverse to the scan arm 21 relative to the process chamber wall 15.

The scan arm 21 is mounted for longitudinal movement on the slide plate 23 and can be driven longitudinally to and fro by a motor 25. The slide plate 23 carrying the scan arm 21 can itself be driven transversely of the scan arm 21 by a drive motor 26. Suitable operation of the drive motors 25 and 26 produce a combined scanning movement of the wafer holder 18 and any semi-conductor wafer thereon in a two-dimensional scan pattern across the ion beam 19.

In a convenient example, the rotary support plate 24 of the scanning system is mounted on the process chamber wall 15 by an air bearing and vacuum seal combination such as disclosed in U.S. Pat. No. 5,898,179 and GB-A-2360332. Similarly, the slide plate 23 is mounted for linear motion on the rotary support plate 24 again by means of an air bearing and vacuum seal combination as disclosed in the above-referred U.S. patent specification. The scan arm 21 is preferably mounted for longitudinal motion through the vacuum seal 22 in the slide plate 23 by the linear motor and compliant air bearing vacuum seal arrangement disclosed in our International Patent Application WO 03/088303, the contents of the specification of which are incorporated herein by reference in their entirety.

In the process chamber of the implanter, a Faraday is located downstream of the wafer holder 18 in a position to absorb the entire ion beam 19 whenever the wafer holder 18 is positioned such that no part of the beam 19 impinges on a wafer 17 on the holder 18, or on the scan arm 21. The total charge absorbed from the ion beam by the Faraday 30 provides a measure of the flux in the beam 19 of ions containing the atomic species to be implanted and hence of the flux of the desired atomic species. A controller 31 receives a signal from the Faraday 30 on a line 32, and is operative to derive from this signal a value for the total beam flux of the desired species. The controller 31 is also operative to control the operation of drive motors 25 and 26 so as to control the scanning motion of the scan arm 21.

In a preferred arrangement, the controller 31 is operative to move the wafer holder 18 in a sequence of linear movements across the beam 19 in the plane of the paper of FIG. 1, with each linear movement separated by a stepwise movement normal to the plane of the paper. The resulting scan pattern is illustrated in FIG. 2 in which the dashed line 35 is the locus of the centre 36 of wafer 17 as it is reciprocated to and fro by the scan arm 21 in the X-coordinate direction, and indexed downwardly, parallel to the Y-coordinate direction, at the end of each stroke of reciprocation.

Figure 2:
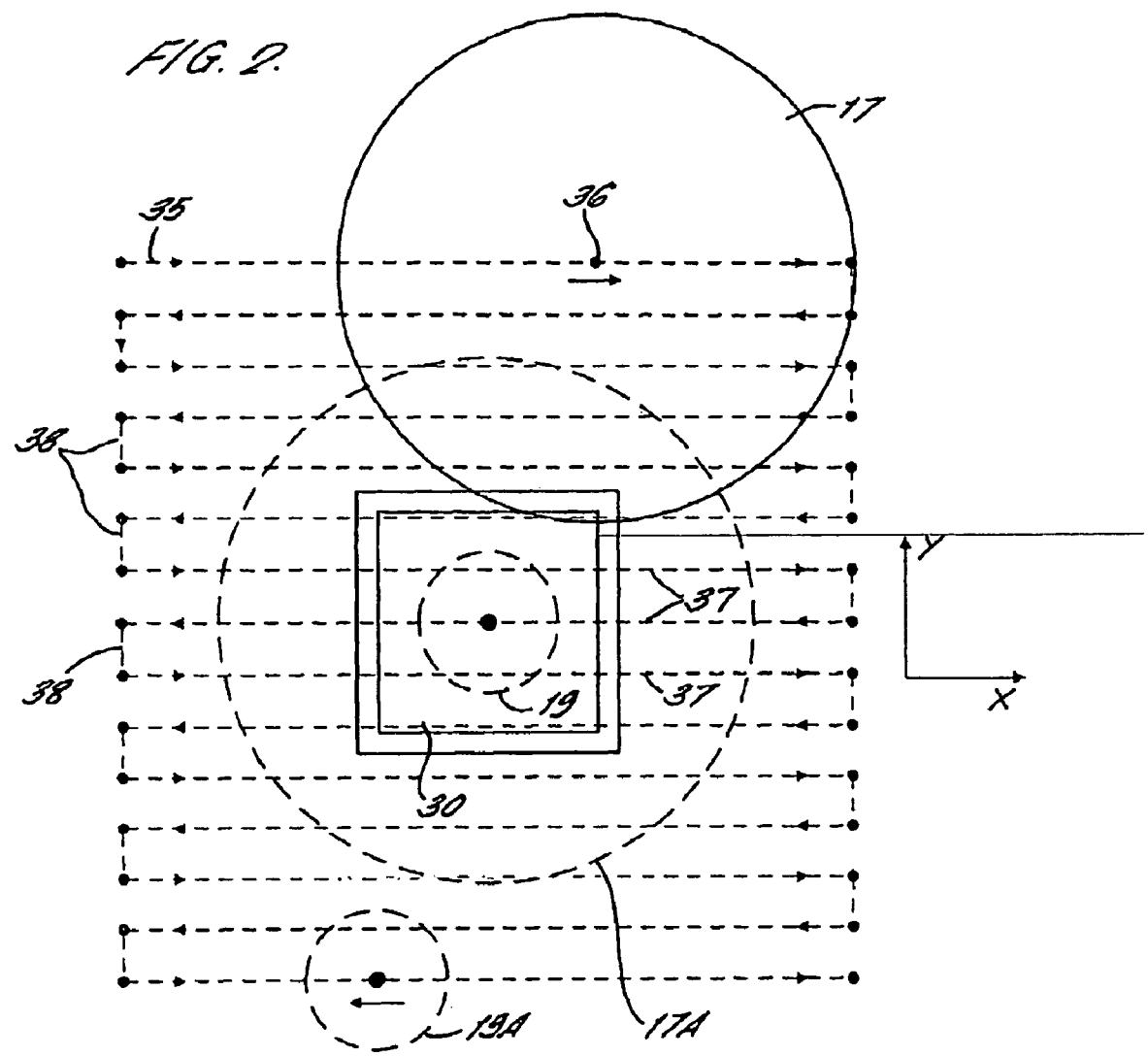
FIG. 2 is a schematic illustration of the mechanical scanning pattern performed by the implanter of FIG. 1 to produce a desired raster.

In FIG. 2, the ion beam 19 is illustrated as having a substantially circular cross-section with a diameter which is substantially less than the diameter of the wafer 17. In practice, the wafer 17 may have a diameter of 300 mm, whereas the diameter of the ion beam is typically 50 mm. As can be seen, the reciprocating scanning action of the wafer 17 ensures that all parts of the wafer 17 are exposed to the ion beam 19. The movement of the wafer 17 causes the beam 19 to make repeated scans over the wafer 17 with the individual scans being parallel and equally spaced apart, until the beam makes a full pass over the wafer.

Although the line 35 in FIG. 2 represents the motion of the wafer 17 on the holder 18 relative to the stationary ion beam 19, the line 35 can also represent a visualisation of the scans of the ion beam across the wafer. For this purpose, the wafer 17 is represented in dashed outline 17a at the centre of the illustrated scan pattern, and the ion beam is represented at 19a. Obviously, the motion of the ion beam 19a relative to the wafer 17a is in the reverse direction compared to the actual motion of the wafer 17 relative to the ion beam 19.

In this example, the controller 31 scans the wafer 17 so that the ion beam 19a draws a raster of non-intersecting uniformly-spaced parallel lines on the substrate. Each line 37 corresponds to a single scan of the ion beam over the substrate. As illustrated, these ion beam scans extend beyond an edge of the wafer 17 to positions 38 at which the beam cross-section is completely clear of the wafer 17a so that no beam flux is absorbed by the wafer. At these positions, the full flux of the beam 19a reaches the Faraday 30 located downstream of the wafer holder 18, so that the full beam current of desired species can then be determined by the controller 31 from the signal on line 32. It will be appreciated that in the visualisation represented in FIG. 2 in which the beam 19a scans over the wafer 17a, Faraday 30 effectively moves with the beam 19a. In practice, of course, the beam 19 and Faraday 30 are fixed and it is the wafer 17 which is moved.

Assuming the beam flux of atomic species to be implanted is constant over time, the dose of the desired species delivered to the wafer 17a is maintained constant over the wafer in the coordinate direction X of the raster lines 37 by maintaining a constant speed of movement of the wafer 17 along the raster lines. Also, by ensuring that the spacing between the individual raster lines 37 is uniform, the dose distribution along the ordinate direction Y is also maintained substantially constant.

In practice, however, there may be some progressive variation in the beam flux during the time taken for the wafer 17 to perform a complete pass over the ion beam 19, i.e. to complete the full raster of lines 37 as illustrated in FIG. 2.

In order to reduce the effect of such beam flux variations during a scanning raster, the controller is arranged to measure the beam flux at the positions 38 when the entire beam flux is absorbed by the Faraday 30 and then use the measured flux to adjust the speed at which the wafer holder 18 is moved over the next scan or raster line 37. If the beam flux measurement at the positions 38 indicates that the beam flux has become less, then the controller ensures that the wafer holder is driven along the next scan line 37 at a slower speed so as to maintain a desired rate of implant of the required atomic species per unit distance of travel of the wafer holder 18 along the scan line. In this way, any variations in the beam current during the course of the formation of a complete raster of scan lines over the wafer does not result in a variation in the dose delivered to the substrate in the scan line spacing direction.

In the example described above, the wafer is maintained in a plane perpendicular to the ion beam during the scanning operation to complete an implant. This is a zero angle implant. Angled implants can also be performed, with the wafer (and more particularly the crystal structure of the wafer) maintained at a desired tilt angle and twist orientation to the implant beam. The wafer tilt angle is adjusted by rotating the entire scanning arrangement 16 on rotary support plate 24 about an axis parallel to the scan arm 21, in the plane of a wafer 17 on the wafer holder 18, and intersecting the ion beam path 19. FIG. 1 is schematic and does not correctly show the geometry of the axis of rotation of plate 24. The wafer twist orientation is adjusted by rotating wafer holder 18, about a normal axis through the wafer centre, with a twist motor 56 on the distal end 20 of the scan arm 21. Because the tilt angle of the wafer is adjusted by rotating the entire scanning arrangement 16, the plane in which the wafer is subsequently scanned is also tilted to a plane $(X, Y^1)$ at the same angle relative to the ion beam. The tilted wafer is then translated during a scanning raster in both X and $Y^1$ directions in a plane parallel to the plane of the wafer.

In the example described so far, the relative movement between the semi-conductor substrate or wafer and the ion beam is provided by mechanically scanning the semi-conductor wafer in two directions transverse to the ion beam. This obviates the need to employ ion beam deflection systems to scan the ion beam itself. However, in different examples, the beam may be scanned, by means of beam deflectors, in at least one of the two transverse directions providing the two-dimensional relative scanning between the wafer and the beam. In all cases, however, the scanning system produces multiple scans of the beam over the wafer in each of one or more passes, whereby the scans draw a raster of non-intersecting uniformly-spaced parallel lines on the substrate. Also the beam flux is measured at positions where the scans extend beyond the edge of the wafer and the speed of the next scan is adjusted to maintain the dose rate per unit length of scan at a desired value.

Figure 3:
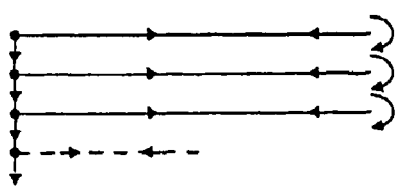
FIG. 3 illustrates an alternative scanning pattern which may be performed.

In the mechanical scanning system described above with reference to FIGS. 1 and 2, the wafer 17 is translated by a uniform distance between each individual scan, that is to say each individual stroke of the reciprocating motion of the scanning arm 21 along its axis, in order to produce the zig-zag raster pattern illustrated in FIG. 2. However, the scanning mechanism may be controlled so that multiple scans are performed along the same line of the raster. For example, each raster line may represent a double stroke or reciprocation of the scanning arm 21 and the wafer holder 18 is then translated by the uniform distance only between each double stroke. The resulting scanning pattern is illustrated in FIG. 3.

Also, FIG. 2 illustrates only a single pass of the beam over the wafer parallel to the Y-coordinate direction, but the complete implant procedure may include multiple passes. Then each such pass of the implant process may be arranged to draw a respective independent raster of uniformly-spaced parallel lines. However, the scan lines of the multiple passes may be combined to draw a composite raster effectively drawn from the scans of a plurality of passes. For example, the scans of a second pass could be drawn precisely mid-way between the scans of the first pass to produce a composite raster having a uniform raster line spacing which is half the spacing between the successive scans of each pass.

As mentioned previously, using a purely mechanical scanning system normally results in the maximum speed of travel of the ion beam over the semi-conductor wafer being limited by the maximum speed of mechanical scanning of the wafer holder. In a mechanical scanning system of the kind illustrated in FIG. 1 and described in more detail in the above-mentioned International Patent Application WO 03/088303, the maximum rate of reciprocation of the scan arm 21 along its longitudinal axis may be of the order of 1 Hz. For a given ion beam current, or flux of the desired atomic species to be implanted, the time during which the semi-conductor wafer can be exposed to the ion beam during the ion implanting process is dictated by the recipe dose of the atomic species to be implanted. Assuming that over-scanning of the wafer relative the ion beam is limited to the amount necessary to ensure an even distribution of dose over the wafer, i.e. a square raster pattern such as illustrated in FIG. 2, it can be seen that the limited total time for the implant in combination with the limited mechanical scan speed dictates the spacing for the raster lines drawn by the scans over the wafer surface, assuming each scan draws a separate line.

Clearly, in order to ensure adequate uniformity of dose delivered to the wafer in the direction of the raster line spacing, this spacing or line pitch must be less than the cross-sectional dimension of the ion beam in the line spacing direction (Y-coordinate direction of FIG. 1). In practice, the dose uniformity is improved with a smaller raster line pitch.

The recipe dose could be delivered to the wafer by performing a single pass drawing a raster of scan lines at the line pitch dictated by the beam current, the mechanical reciprocation rate of the scanning mechanism, and the required recipe dose. However, it may be preferable to deliver the same recipe dose to the wafer in multiple passes of the wafer across the ion beam, in order to reduce the thermal loading of the wafer caused by the impinging ion beam. Then, in order to maximise dose uniformity, the scan lines drawn during each pass are preferably arranged to interleave scan lines of the previous pass to produce a composite raster with a reduced line pitch.

Figure 4:
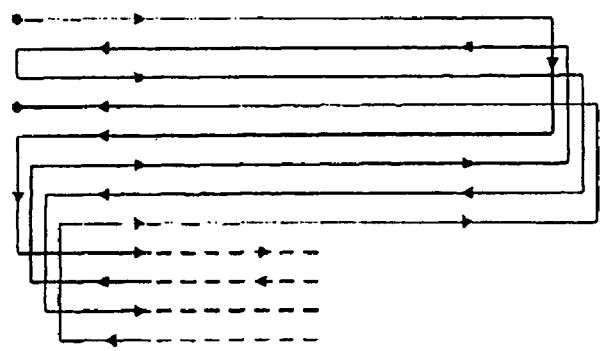
FIG. 4 illustrates a further scanning pattern.

For example, if the line pitch dictated by the recipe dose requirements as explained above is T, then each of four passes could be made with scans separated by 4T. Each of the passes is arranged to spatially phase shift the scans of the pass by the amount T, so that the composite raster drawn by the four passes has lines with the pitch T. In this way, the thermal loading of the wafer is reduced whilst ensuring the raster line pitch is maintained at the desired value T. FIG. 4 illustrates a part of the scanning pattern of four interleaved passes as described above.

A modified version of interleaved scanning is illustrated in FIGS. 13a, 13b, 13c and 13d. In a known implant procedure, a desired implant dose is divided into equal parts with each part delivered to the wafer with the wafer at a different twist orientation. In the case of a zero angle implant, with the wafer nominally normal to the ion beam, the required recipe dose may be delivered in four equal parts, with the parts being delivered with the wafer at respective equally spaced orientations about an axis normal to the wafer plane (and parallel to the ion beam). Thus, the different orientations for the four different parts of the implant dose are spaced by 90° in this example. The resulting implant procedure is sometimes referred to as a "quad" implant. One purpose of such quad implants is to cancel out the effect of any non-uniformity in the distribution of implant angles of the ions in the beam.

In any such implant procedure where different parts of the implant dose are delivered with the wafer orientation twisted through 180°, each part of the dose may be delivered by a separate pass of the scanned wafer through the beam, producing a distinct raster of scanned ions over the wafer. Then, rasters generated with the wafer twisted through 180° can be interleaved in order to improve dose uniformity.

Figure 13A:
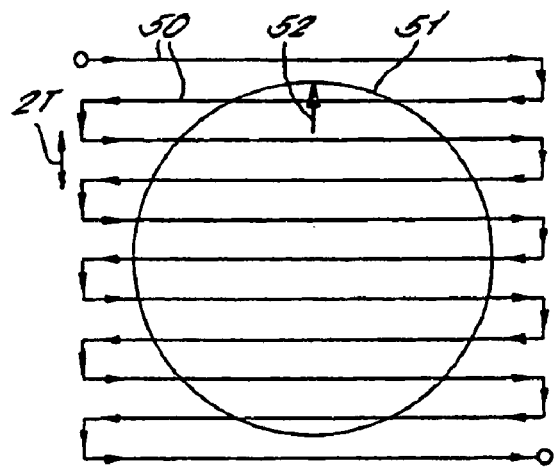
FIGS. 13a to 13d illustrate interleaved scanning rasters for a quad implant.

FIG. 13a illustrates a first raster of scan lines 50 having a scan pitch of 2T. This first raster is performed with the wafer 51 in a first orientation indicated by the position of arrow 52. Before performing a second raster of scan lines, the wafer is re-oriented by 180° to the position shown in FIG. 13b. A second raster of scan lines is then performed with the lines 53 of a second raster interleaved midway between the lines 50 of the first raster. The resulting composite of two rasters has an overall line pitch of T, so that the dose uniformity in the direction perpendicular to the scan lines 50 and 53 can be increased.

Figure 13B:
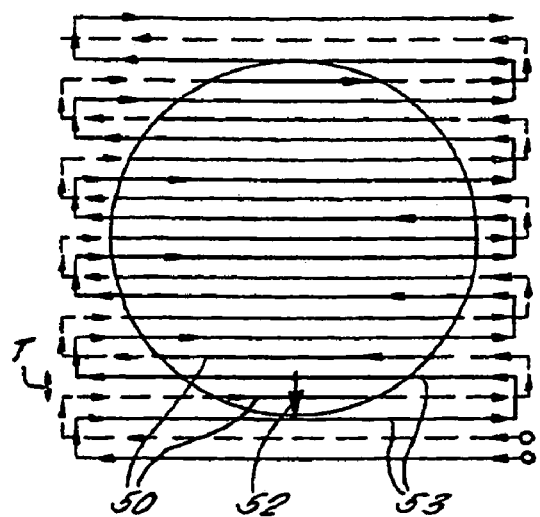
Figure 13C:
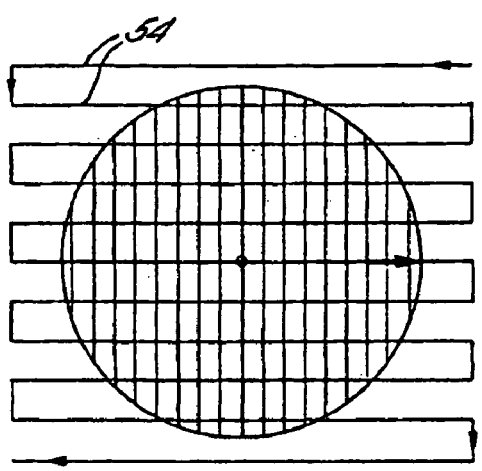
Figure 13D:
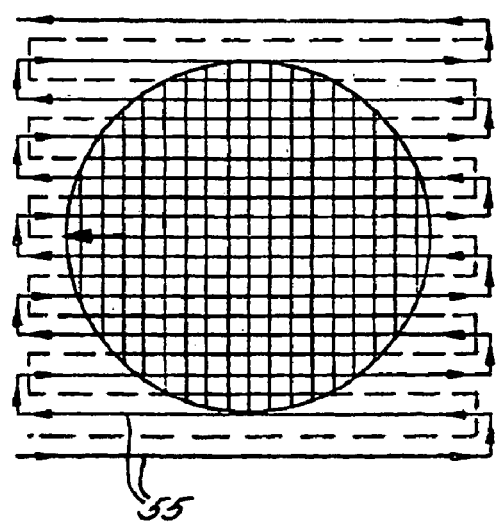

To complete the quad implant, two further rasters of scan lines 54 and 55 are performed as illustrated in FIG. 13c and FIG. 13d, with the wafer orientated at 90° and 270° relative to the orientation of FIG. 13a. Again the scan lines 55 of the fourth raster are arranged to be interleaved midway between the scan lines 54 of the third raster.

A quad implant of this kind can be performed by suitably programming the controller 31 in FIG. 1 to perform four separate passes of the wafer through the beam, and operating a rotation drive motor 56 to re-orient the wafer holder 18 as required between each pass.

In the above described example, the quad implant is performed with a zero implant angle, so that the normal to the wafer is parallel to the ion beam. However, if the implant is performed with the wafer tilted, e.g. to provide an angled implant as described above, it may sometimes be desirable to adjust the orientation of the wafer for the different segments of the implant, not about an axis normal to the wafer, but about an axis parallel to the ion beam. In this way, the angle of the beam relative to the crystal axes of the wafer remains the same for the different segments of the implant.

Although a "quad" implant is described in the example above, the same interleaving of rasters with the wafer rotated by 180° can be performed in higher order implants with the wafer re-orientated at 60° angular intervals (a "sextal" implant), 45° intervals (an "octal" implant), or any other angular interval which is an even factor of 360°.

In particular, a "dual" implant may be performed, in which the total desired implant dose is divided into just two parts, a first part being delivered with the wafer at a first twist orientation and a second part delivered with the wafer twisted through 180° relative to the first twist orientation. In the specific example illustrated in FIG. 13, this would correspond to delivering half the total implant dose with the wafer orientated as in FIG. 13a and the rest of the dose with the wafer oriented as in FIG. 13b.

The inventors have determined that a dual implant as described above can provide all the advantages of a quad implant, when implanting at nominally zero implant angle, using an implanter which mechanically scans the wafer in a fully planar fashion through an ion beam which is cross-sectionally smaller than the wafer in both orthogonal directions e.g. a pencil ion beam. Then the principal or only purpose in performing a quad implant is to average out any beam angle alignment errors which can arise over successive implants, due to variations in day-to-day setup or wafer crystal orientation.

Any such angle alignment error for a zero angle implant can be expressed in angular co-ordinates ($\theta$, $\phi$), where $\theta$ is angular deviation in a beam containing plane at angle $\phi$. Importantly, reversing the twist orientation of the wafer by 180° for the second half of the dose, is effective to average out the angular deviation $\theta$, (between $-\theta$ to $+\theta$) relative to the wafer, irrespective of the value of $\phi$.

Since, for advanced devices, most high current implants are nowadays done at zero implant angle, performing a dual implant as described above, to achieve the same benefits as a quad implant, has significant advantages. Single wafer implanters which mechanically scan a wafer in two dimensions through a fixed ion beam mechanically reciprocate the wafer back and forth through the beam in a fast scan direction, while progressively translating the wafer in a slow scan direction to complete a pass forming a raster of fast scans covering the wafer.

In order to achieve a desired dose uniformly on the wafer in the slow scan direction, transverse to the raster lines of the fast scan, the scanning should be done with a pitch between successive scan lines in the raster, which is sufficiently small compared to the width of the ion beam in the slow scan direction. This usually sets a minimum scan line pitch to achieve required dose uniformity, implying a minimum number of scan lines in a pass over the wafer. Practical mechanical scanners have a maximum fast scan frequency, so that a predetermined minimum time is required to complete a single pass comprising the above minimum number of scans.

Clearly therefore, in the absence of any interlacing of scan lines from different passes, a dual implant requiring two passes can take half the total time of a quad implant requiring four passes.

If the scan lines of passes at 180° opposite orientation are interlaced, as described above with reference to FIG. 13, each pass may have half the number of scan lines for the same dose uniformity. However a dual implant with interlace can still take only half the time of a quad implant with interlace.

In summary, significant advantages arise from performing a dual implant rather than a quad implant with an implant which mechanically scans a wafer in two-dimensions through a fixed beam and which scans in the wafer plane, whenever the implanter has a minimum practical duration for a single two-dimensional pass of the wafer through the beam.

The dual implant method described above can be performed by an implanter which scans the wafer in a rectilinear fashion with parallel fast scans separated by steps in the slow scan direction, or with zig-zag like fast scans formed with continuous movement in the slow scan direction. Further, the fast scan and/or the slow scan directions of movement need not be linear, but may comprise arcs of a circle or other curve.

In addition to, or separately from, the above described advantages of a dual implant, there are advantages in performing a 2-D mechanical scan-type implant with a 180° twist in wafer orientation between each raster or slow pass through the ion beam. With 2-D mechanical scanning, the passes of a wafer back and forth through the ion beam in the direction transverse to the raster scan lines are relatively slow, due to mechanical constraints. By reversing the orientation of the wafer before each slow pass through the beam, excessive thermal loading of the leading edges of the wafer during the passes in each direction is avoided. Such excessive thermal loading would otherwise occur because, without a 180° twist, the leading edge of a wafer starting a new pass is also the last part of the wafer to leave the ion beam at the end of the preceding pass.

The above thermal loading advantages can be obtained, at least in part, even if the alternating passes of the wafer do not deliver the same dose, i.e. passes in one direction deliver more dose than passes in the other direction, or if the dose delivered varies over each pass.

In the examples described above and illustrated in FIGS. 13a to 13d, the spatial phase shift between the interleaved rasters is 50% of the pitch of each individual raster, assuming the scan lines shown in FIGS. 13a to 13d represent the locus of the centre of the beam. This is fine for a beam having a profile which is symmetric in the Y, or scan line spacing, direction. However, the implant beam is commonly somewhat asymmetric. With a beam which is asymmetric in the Y-direction, and assuming the beam centre in the Y-direction is the mid point of the beam, rasters interleaved with a phase shift of 50% of the pitch on a wafer which has been re-orientated or twisted by 180°, can result in a non-uniformity of dose in the Y-direction which is significantly worse than would be obtained when performing the two interleaved rasters on a wafer held at a constant orientation.

The reason for this can be understood from the following analysis. In the case of a symmetric beam (in the Y-direction), re-orientating the wafer by 180° between interleaved rasters makes no difference to the distribution (or the "footprint") on the wafer of beam flux in the Y-direction from the scan lines of the two rasters. Therefore the symmetrical footprint of the Y-profile of the beam on the wafer resulting from the interleaved rasters is repeated identically with an effective spacing T/2 equal to half the pitch T of each of the rasters (as illustrated in FIG. 13b).

However, for a beam which has an asymmetric profile in the Y-direction, the corresponding asymmetric footprint of the Y-profile of the beam on the wafer is reversed during the second raster. As a result, identical footprints of the Y-profile of the beam on the wafer are repeated in the interleaved rasters with an effective spacing equal only to the pitch T of each of the rasters. The asymmetric features of the Y-profile have an effective spacing T, whereas symmetric features would have an effective spacing T/2. Since uniformity strongly correlates with the effective spacing, the resulting uniformity for a beam which is asymmetric in the Y-direction is worse.

This degradation of uniformity for interleaved scans with 180° wafer twist can be almost completely eliminated by selecting a phase shift between the interleaved rasters different from T/2 (50% of the pitch of each raster). An optimum phase shift, different from T/2, can be determined from the measured Y-profile of the beam and the intended pitch T of each raster.

A numerical analysis is performed using a computer to calculate the dose distribution in the Y-direction from a single raster of line scans at a pitch T. Then, this dose distribution is numerically superimposed on its mirror image at different spatial phase shifts between the two and the resulting combined dose distributions calculated for the different phase shifts in order to find the optimized phase shift providing the minimum dose variation in the Y-direction for the particular pitch value T.

Calculating the optimized spatial phase shift values over a range of single raster pitch values T for a typical asymmetric beam profile shows that a dose uniformity can be obtained which not only matches that for the asymmetric beam interleaved at 50% without 180° wafer twist (same as a single raster at pitch T/2), but can provide at some values of T a significantly better uniformity. This is illustrated in FIGS. 15, 16 and 17.

Figure 15:
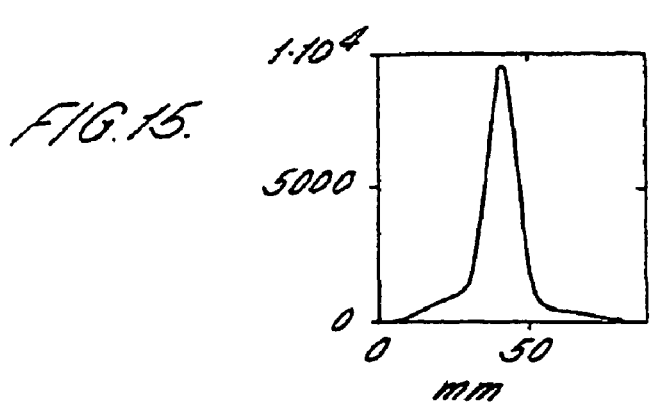
FIG. 15 is a graphical plot of the cross-sectional ion current profile of an ion beam.

FIG. 15 is a graphical representation of a somewhat asymmetric beam profile in the Y-direction. FIG. 16 shows plots of non-uniformity of dose (y-axis) against the pitch (x-axis) of scan lines for a raster of parallel scans on a wafer, using the beam profile of FIG. 15. In FIG. 16, line 70 is the non-uniformity from a single raster at various pitches for a zero angle implant. Line 71 is the non-uniformity of two superimposed rasters, each having the same pitch as the single raster of line 70 and spatially phase shifted by 50%, without any re-orientation of the wafer between the rasters. Therefore the plot of line 71 corresponds to the plot of line 70 shifted to the right by doubling the pitch values on the x-axis.

Figure 16:
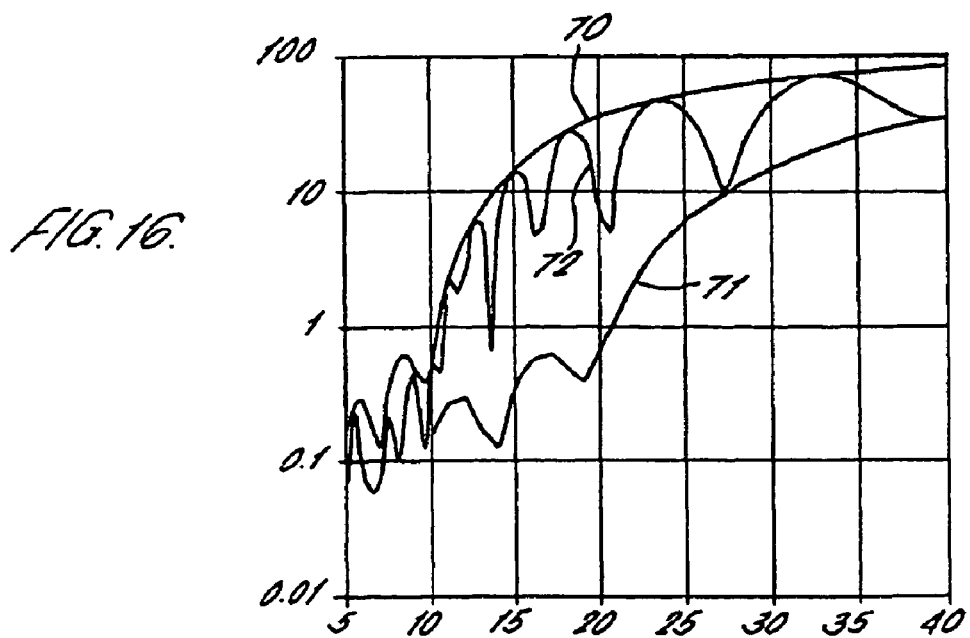
FIG. 16 is a graphical plot of implant uniformity for interleaved rasters of scan lines against the pitch of the scan lines.

Plot line 72 in FIG. 16 is the non-uniformity of the two superimposed rasters spatially phase shifted by 50%, but with the second raster applied to the wafer after 180° twist. The 50% raster shift is applied to the scan line locus of the centre of the asymmetric beam in the Y-direction.

Figure 17:
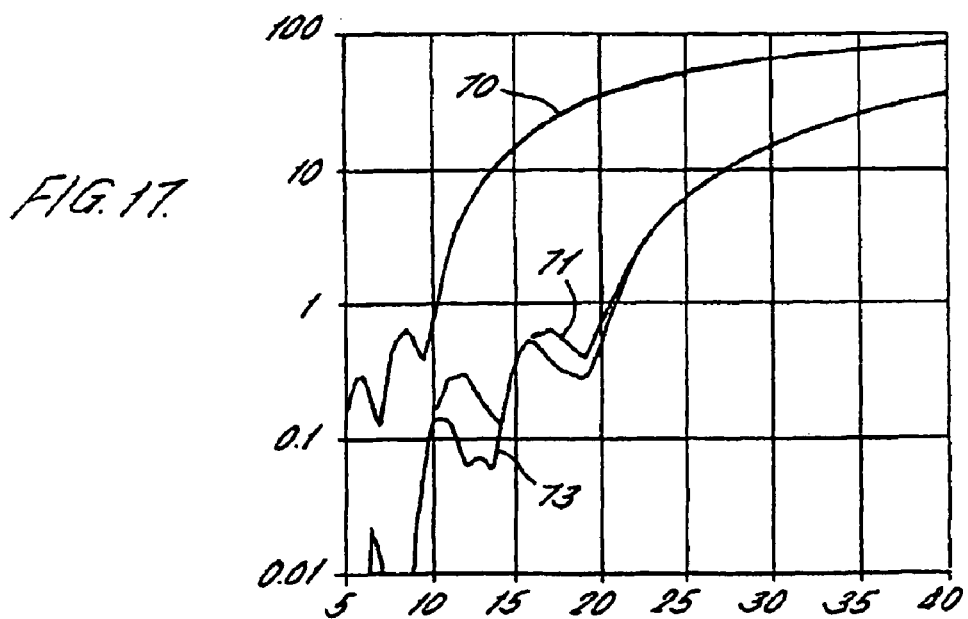
FIG. 17 is a graphical plot similar to FIG. 16 showing the advantage of optimising the shift between the interleaved rasters.

By comparison, plot line 73 in FIG. 17 is the uniformity of the rasters superimposed with 180° twist and with raster shift optimized for each value of pitch. As can be seen the uniformity obtained at certain low pitch values is actually better than that obtainable without 180° twist. This improvement is counter-intuitive. However, it can be understood following realization that combining an asymmetric profile with its mirror image at an optimised pitch shift can produce a combined profile which is both symmetrical and also wider than the original asymmetric profile. The uniformity of dose achievable for scan lines at a selected pitch is strongly correlated with the effective beam profile width in the scan line spacing direction. Therefore, even though the raster formed by the combined profile has a pitch (between the footprints on the wafer of the composite lines formed by the combined profile) which is equal to the actual pitch T of each of the separate rasters of beam scan lines, uniformity can be good because the combined profile is symmetrical and can have an effective width rather larger than the actual width of the ion beam profile.

Figure 14:
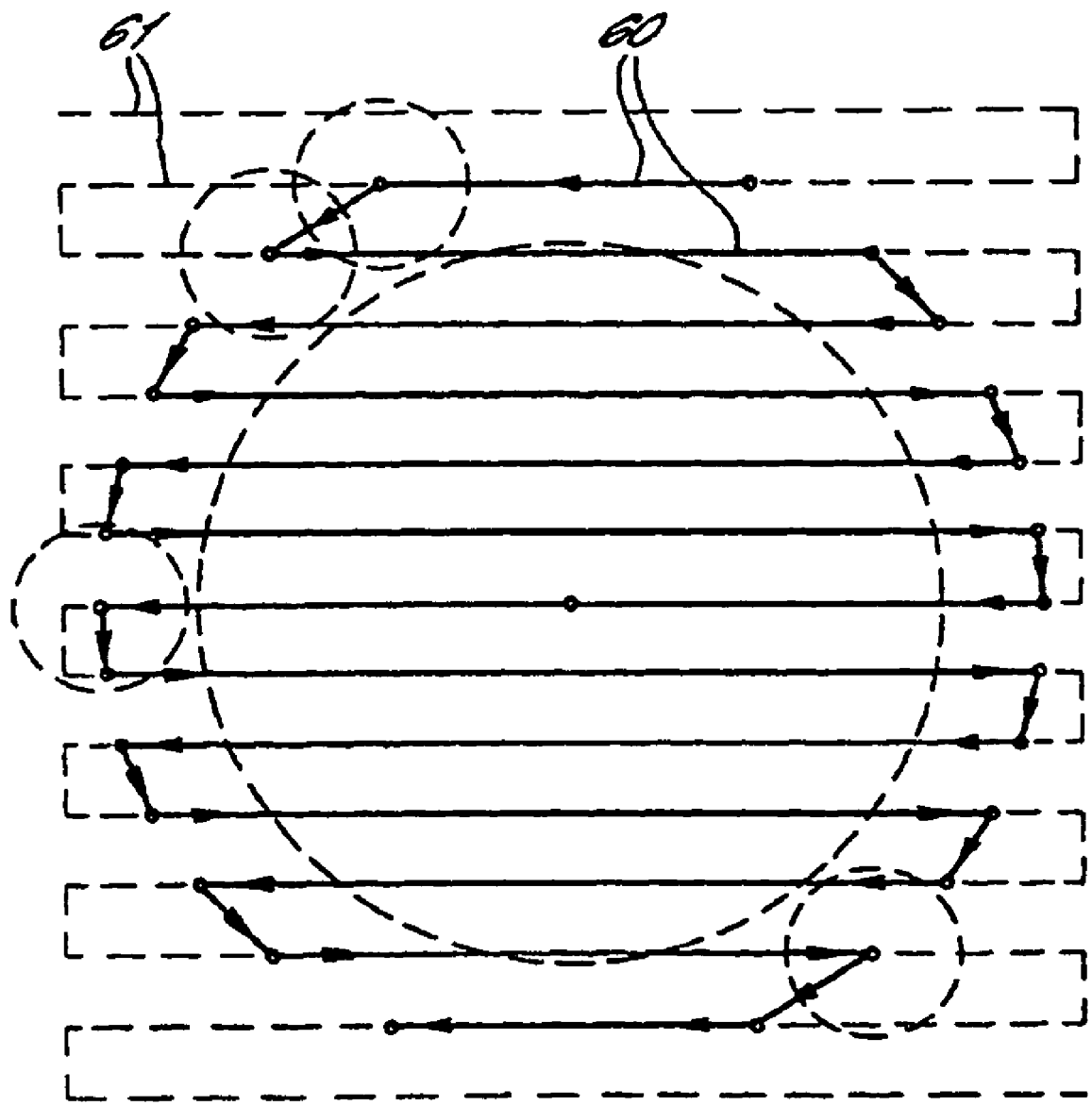
FIG. 14 illustrates a profiled raster to improve productivity.

In the examples of rasters of scan lines described above, the overall raster is substantially square in outline, even though the wafer to be implanted is circular. If it is required to improve productivity and reduce the amount of time during each raster that the beam is passing the wafer so that no beam flux is being absorbed, the scan lines can be adjusted in length to minimize the amount of time that no beam flux is being absorbed on the wafer. A modified raster is illustrated in FIG. 14 in which the relative movement of the beam over the wafer is illustrated by lines 60, and the dotted lines 61 illustrate those parts of the rectangular raster which are left out of the modified scan pattern. As a result, the time to produce the raster illustrated in FIG. 14 is reduced and productivity of the implanter can be increased. Throughput can be increased by 10-20%. The scan pattern may not be completely circular as illustrated in FIG. 14. For example, if the beam profile is measured to be asymmetric, the scan lines may extend further beyond the wafer edge on one side than the other. Further, if an angled implant is performed, the outline shape of the scan pattern in a plane perpendicular to the beam direction is modified accordingly and may become elliptical. Also, it can be desirable for dosimetry reasons to permit the entire beam current to bypass the wafer and holder and enter the beam stop Faraday for longer periods at some time or times during an implant. A suitable scan pattern outline might therefore be substantially circular but with one complete square corner. As before, FIG. 14 for convenience illustrates the way the beam scans over the wafer, whereas in a mechanically scanned apparatus as illustrated in FIG. 1, it is in fact the wafer which is scanned over a stationary beam.

Although the raster line spacing which can be used with a mechanical scanning system is dictated by the recipe dose and beam current, as explained above, it is nevertheless important to ensure that the line spacing or pitch is small enough to provide the desired dose uniformity in the spacing direction. This uniformity is a function of the shape of the beam profile and the raster line pitch. A smaller pitch results in a more uniform dose distribution over the wafer. The following is a mathematical description of how the uniformity varies as a function of scan pitch for a parallel line scanning pattern. Fourier transformation is used as a tool since the analysis involves periodic patterns in dose distribution.

In this study, it is assumed that beam current and profile do not change during an implant. Time dependency is not treated, although that is very similar. Notations $\tau$, t, u, v and T are used as spatial variables, and likewise, $\omega$ and 1/T as spatial frequencies.

In a parallel line scanner, implant dose h(t) at a location t on a wafer can be written using a periodic $\delta$-function as:—

$$h(t) = \int_0^1 b(\tau) \cdot \delta_T(t-\tau) d\tau, \quad \quad 1)$$

$$\left( \delta_T(t-\tau) = \sum_{n=-\infty}^{\infty} \delta(t-\tau-nT) \right)$$

where $b(\tau)$ is the beam profile in the slow scan direction (y in FIG. 2) and $\delta_T(\tau)$ is a periodic $\delta$-function of period T. T corresponds to one translation step or the spacing between raster lines in a composite raster. FIG. 5 illustrates the functions and FIG. 6 illustrates the raster scanning pattern. The wafer 17 is scanned in front of the beam 19 in parallel lines spaced apart by a constant distance T. For simplicity, $b(\tau)$ is defined within a range [0, 1]. In other words, the step T is normalized to the actual beam size. Equation 1 gives the accumulated dose at a location t after one complete slow scan or one complete raster with 1/T fast scans. Dose h(t) is also a periodic function with a period T.

Fourier transforms of the functions of Equation 1 are defined as follows:

$$b(t) \xrightarrow{FT} B(\omega)$$

$$\delta_T(t) \xrightarrow{FT} \Delta_{\omega_0}(\omega)$$

$$h(t) \xrightarrow{FT} H(\omega)$$

The Fourier transform of a periodic $\delta$-function is also a periodic $\delta$-function.

$$\Delta_{\omega_0}(\omega) = \omega_0 \cdot \sum_{n=-\infty}^{\infty} \delta(\omega - n\omega_0), \quad \quad 2)$$

$$\omega_0 = 2\pi/T$$

Using the convolution theorem and notations above, Equation 1 is transformed as:

$$H(\omega) = B(\omega)\Delta_{\omega_0}(\omega) = \qquad\qquad 3)$$

$$\omega_0 \cdot B(\omega) \cdot \sum_{n=-\infty}^{\infty} \delta(\omega - n\omega_0) = \omega_0 \cdot \sum_{n=-\infty}^{\infty} B(n\omega_0) \cdot \delta(\omega - n\omega_0)$$

This is a significant result. Equation 3 shows that the Fourier transform of dose h(t) consists of a series of impulses with a constant interval $\omega_o = 2\pi/T$, and that the amplitude of each impulse at $\omega = n\omega_o$ is equal to $\omega_o B(n\omega_o)$, that is $\omega_0$ times the spectral density of beam profile at $\omega = n\omega_0$.

Variance, $\sigma^2$, of the implant is defined as $$\sigma^2 = 1/T \cdot \int_0^T (h(t) - \overline{h(t)})^2 \, dt \qquad\qquad 4)$$

where $\overline{h(t)}$ is the average dose. The integration is performed in the region of [0, T] since h(t) is a periodic function of period T.

$$\overline{h(t)} = 1/T \cdot \int_0^T h(t) \, dt = \frac{1}{2\pi} H(0) = \frac{\omega_0}{2\pi} \cdot B(0) \qquad\qquad 5)$$

If the dose deviation is written as $f(t) = h(t) - \overline{h(t)}$ and $$f(t) \xrightarrow{FT} F(\omega),$$

then from Equation 4, $$\sigma^2 = 1/T \cdot \int_0^T f(t)^2 \, dt$$

This is the definition of the power of f(t). Using Parseval's theorem this can be expressed as:

$$\sigma^2 = \sum_{n=-\infty}^{\infty} |F_n|^2$$

where $|F_n|$ is the amplitude of the n-th term of Fourier series.

From Equations 3 and 5, $$F(\omega) = H(\omega) - H(0) = \omega_0 \cdot \sum_{n=-\infty}^{\infty} B(n\omega_0) \cdot \delta(\omega - n\omega_0) - \omega_0 \cdot B(0) \cdot \delta(\omega)$$

$$= \omega_0 \cdot \sum_{n=-\infty}^{-1} B(n\omega_0) \cdot \delta(\omega - n\omega_0) + \omega_0 \cdot \sum_{n=1}^{\infty} B(n\omega_0) \cdot \delta(\omega - n\omega_0)$$

$$F_n = \frac{1}{2\pi} F(n\omega_0) = \frac{\omega_0}{2\pi} B(n\omega_0), \, (n = \ldots -2, -1, 1, 2, \ldots)$$

Since b(t) is real, $|B(n\omega_0)| = |B|(-n\omega_0)|$.

Therefore, $$\sigma^2 = 2 \cdot \frac{\omega_0^2}{4\pi^2} \cdot \sum_{n=1}^{\infty} |B(n\omega_0)|^2$$

and the standard deviation, $\sigma$ is $$\sigma = \frac{\omega_0}{2\pi} \cdot \sqrt{2 \cdot \sum_{n=1}^{\infty} |B(n\omega_0)|^2} \qquad\qquad 6)$$

The relative standard deviation, $\sigma_r$, normalized to the average dose, $\overline{h(t)}$ (see Equation 5), is $$\sigma_r = \sigma / \overline{h(t)} = \sqrt{2 \cdot \sum_{n=1}^{\infty} |B(n\omega_0)|^2} \bigg/ B(0) \qquad\qquad 7)$$

Equations 6 and 7 describe how dose non-uniformity depends on $\omega_0$, thus on the slow scan step T. The standard deviation of the dose implanted at a frequency 1/T consists of the amplitudes of $B(n\omega_0)$, ($\omega_0 = 2\pi/T$, n=1, 2, ... ) in the spectral density of the beam function. $\sigma$ does not contain an amplitude $B(\omega)$ for $\omega \neq n\omega_0$ nor for $\omega = 0$. Equations 6 and 7 are mathematically accurate only when the infinite summation is performed. However, $B(\omega)$ is usually a fast diminishing function of $\omega$, and a fairly good approximation of $\sigma$ and $\sigma_r$ is obtained by summing only a few lower harmonic terms in the series.

Calculating $B(\omega)$ in the continuous frequency domain is time consuming. Instead, one can use Fast Fourier transform (FFT) and derive values of $B(\omega_n)$ for the discrete frequencies, $\omega_n = 2n\pi (n=0, 1, 2, \ldots)$. FFT of a beam profile that consists of $2^I$ data points yields $B(\omega)$ only up to $\omega_{I-1} = 2\pi \cdot 2^{I-1}$. If the beam profile function is measured and known as a vector each element of which corresponds to $b(\Delta\tau \cdot m)$, m=0, 1, 2, ..., $2^7$), for instance, one can achieve $B(\omega)$ up to a frequency of $2^{7-1} = 64$ Hz. Equations 6 and 7 then provide fairly accurate values of $\sigma$ and $\sigma_r$, respectively, up to a frequency of $2^{7-2} = 32$ Hz. $B(\omega)$ can be derived at non-integer frequencies by using the scaling property of the Fourier transform. With $\alpha > 1$ being a scaling factor, the Fourier transform of a function $b(\alpha t)$ yields $B(\omega)/\alpha$ for a series of frequencies, $\omega_n = 2n\pi/\alpha$ (n=0, 1, 2, ...).

FIG. 7 shows the calculated $\sigma_r$ as a function of frequency, 1/T, for the arbitrary beam profile function shown in FIG. 5. FFT is performed for $b(\Delta\tau \cdot m)$ up to a length $2^7$. A typical requirement is for $\sigma_r$ to be smaller than 0.5% after an implant.

From the graph, one can choose 1/T>8 as the implant scan spatial frequency. Thus the slow scan step or normalised scanning raster line spacing T should be less than ⅛th of the beam dimension in the spacing direction (Y) to meet the required dose uniformity $\sigma_r < 0.5\%$.

In FIG. 8, a plot of $\sigma_r$ is shown after applying the scaling property to $B(\omega)$ with two different values of $\alpha$.

Figure 9:
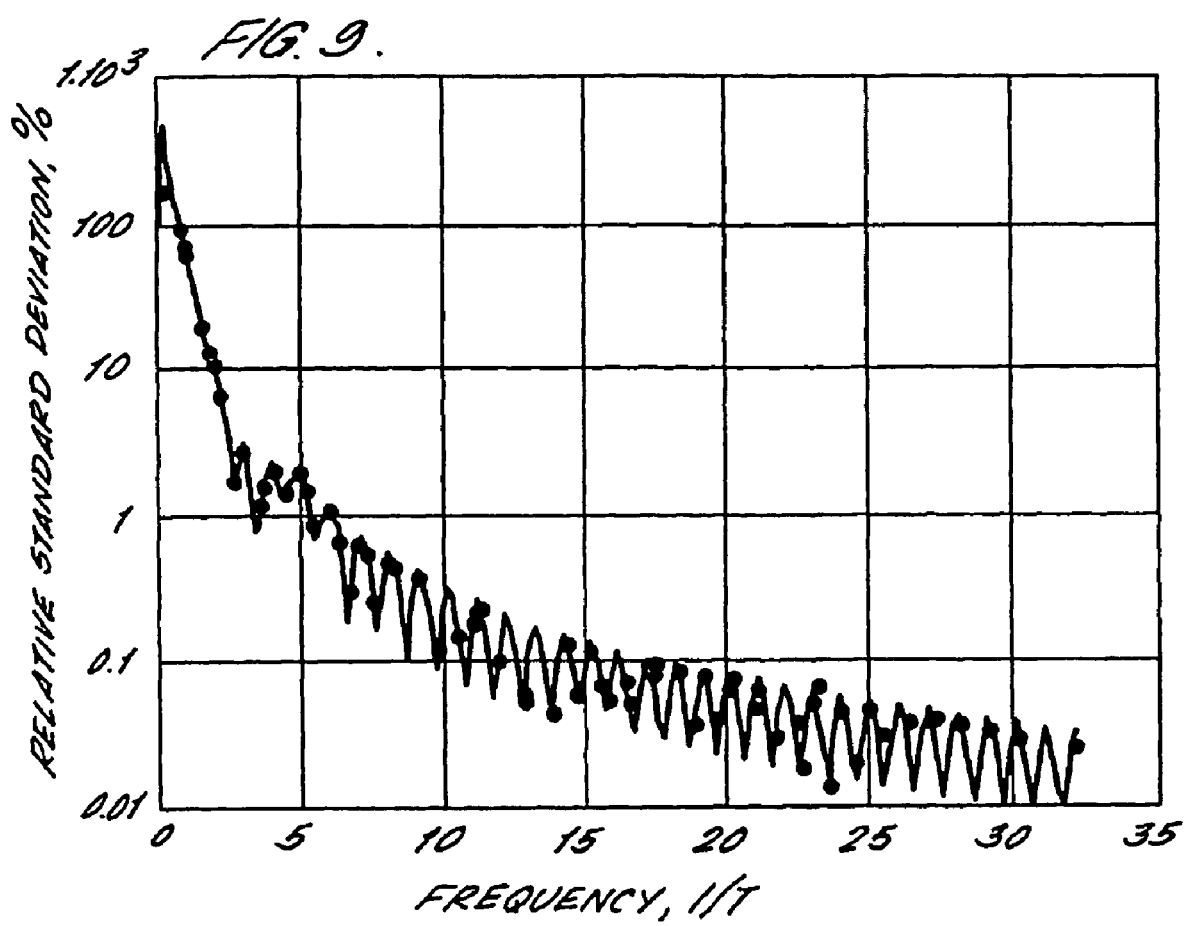
FIG. 9 is a further graphical representation of the dose uniformity against spatial frequency of raster lines calculated more precisely.

In FIG. 9, the FFT result is compared to that of exact calculation by Equation 4. The FFT agrees with the exact curve well despite that the beam profile b(t) was sampled at only $2^7 = 128$ points. It may be noticed that $\sigma_r$ has a periodic pattern in addition to a fast diminishing trend as frequency rises.

Figure 10:
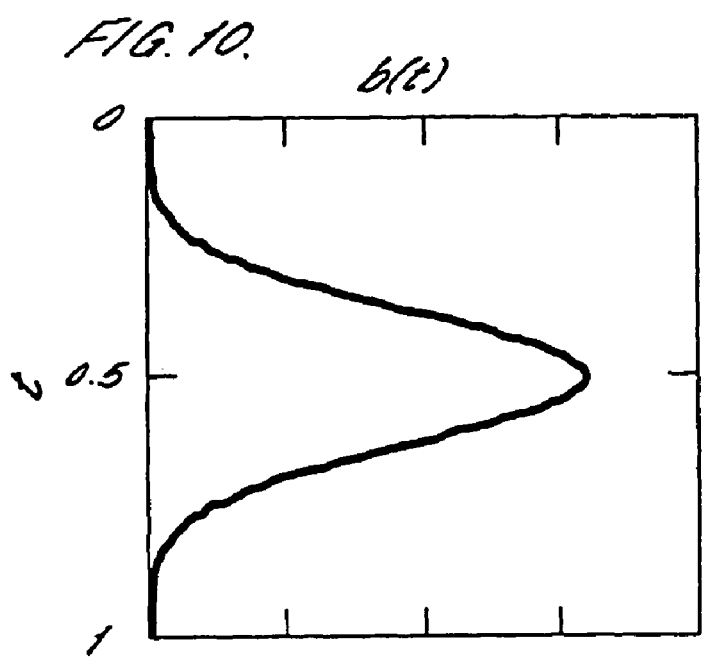
FIG. 10 is a graphical representation of an idealised beam profile in the form of a Gaussian function.

If the beam profile function is a Gaussian, as illustrated in FIG. 10, $\sigma_r$ diminishes very quickly as scan pitch decreases. This is because Fourier transform of a Gaussian function is also a Gaussian, as shown below:

$$b(t) = \exp(-a^2 t^2) \xrightarrow{FT} B(\omega) = (\sqrt{\pi}/a) \cdot \exp(-\omega^2/4a^2) \qquad 8)$$

It can be seen that $\sigma$ approaches 0 fast due to the term $|B(n\omega_0)|^2 = (\pi/\cdot a^2) \cdot \exp(-n\omega_0^2/2a^2)$. A smaller value a in Equation 8 gives a broader profile and faster decrease in $\sigma$.

Figure 11:
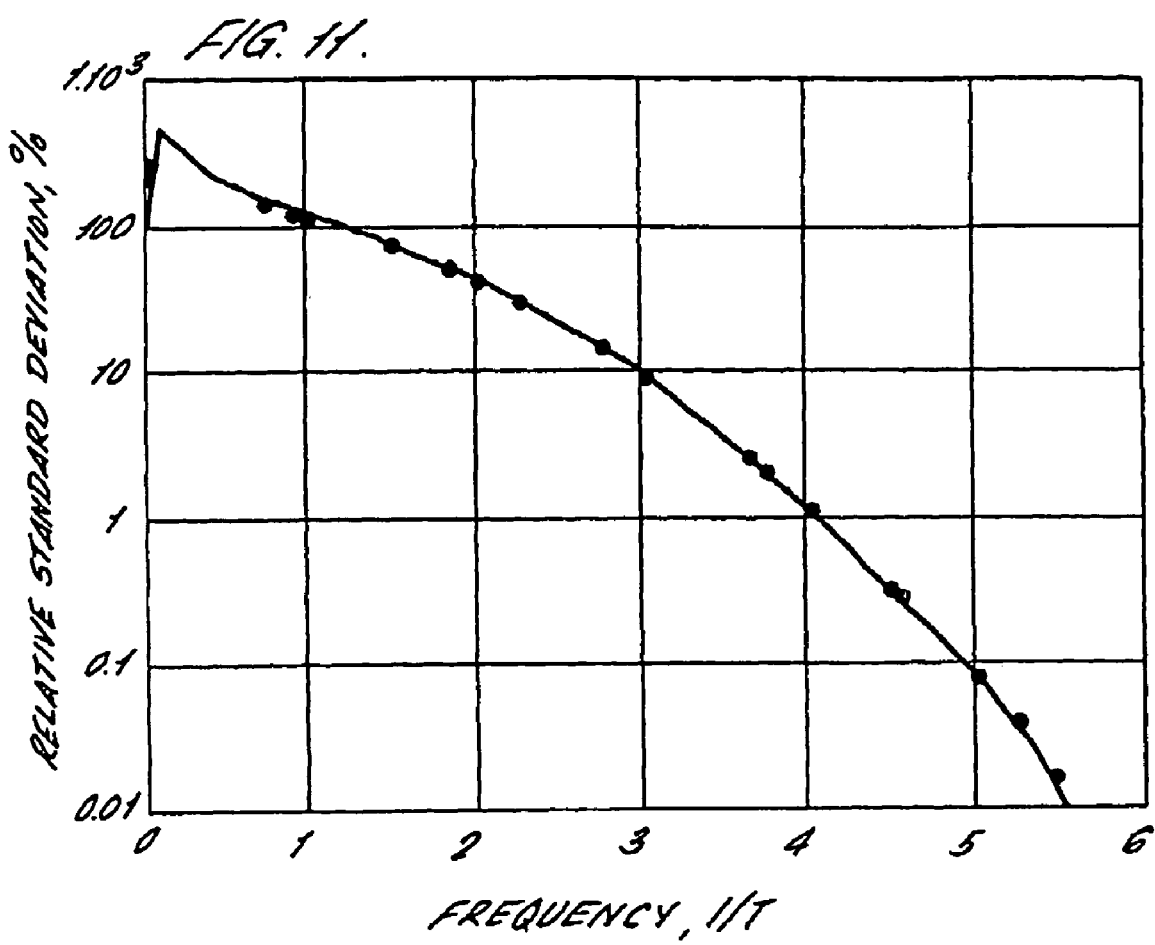
FIG. 11 is a graphical representation of calculated dose uniformity against the spatial frequency of scanning raster lines for the Gaussian profile of FIG. 10.

The graph shown in FIG. 11 illustrates the case where a=5.7. $\sigma_r$ falls below 0.5% at 1/T=4.3 Hz. This is almost half the frequency of the arbitrary beam profile of FIG. 5.

Summarising the above, a fast Fourier transform method can be used to calculate the variation in dose uniformity across the wafer in the raster line spacing direction with raster line pitch, for a particular beam profile function in the spacing direction. In operation, the above calculations can be performed quickly by a computer, such as a computer used for other implanter control functions. Known FFT processors or software applications may be used for this purpose. Instead of FFT techniques, the uniformity calculations may be performed in other ways, such as by use of computer simulation.

When performing an implant using the above-described scanning process, the value for the raster line spacing of the scanning is selected which is sufficiently small relative to the beam dimension in the spacing direction to ensure that the dose uniformity in this direction meets the required standard, <0.5% in the above-described examples.

A number of different procedures may be used for determining the profile function of the ion beam in the raster line spacing direction for use in the above calculations of dose uniformity. For example, the arrangement disclosed in the above-referred U.S. patent application Ser. No. 10/119,290 may be employed. In this arrangement a small Faraday having an opening of typically 1 cm², is mounted on the scanning arm 21, so that it can be scanned across the ion beam by appropriate operation of the motors 25 and 26 to drive the scanning arm 21 in its two component directions. A full two-dimensional map can then be made of the beam cross-sectional profile, in both X- and Y-directions and the effective profile function in the Y-direction can be calculated.

Using the measured profile function in the Y-direction, the maximum value can be calculated as outlined above of raster line spacing or pitch which can provide the desired dose uniformity. When performing the implant, the scanning mechanism is then controlled to ensure that the raster line spacing employed does not exceed the calculated maximum.

In practice, it is often desirable to use a raster line spacing for the scanning which has been calculated from the beam current available, the dose of ions to be implanted per unit area of wafer, according to the implant recipe, and the speed at which the scanning mechanism can complete the desired number of passes across the beam (which is in turn dependent on the maximum scan speed in the X-direction. Accordingly, before performing an implant, this desired value of the raster line spacing is calculated, having measured the beam cross-sectional profile and the beam current available. Then, this desired line spacing is compared with the calculated variation of dose uniformity obtained for different line spacings to ensure that the calculated desired spacing value will give the required dose uniformity. The implant proceeds only if the calculated spacing value provides satisfactory uniformity.

If the calculated uniformity using the desired spacing value is worse than the desired uniformity, the beam flux may be reduced. Reducing the beam flux results in the calculated line spacing also being reduced. The beam flux is reduced to a level at which the calculated dose uniformity meets the required standard. The beam flux may be reduced by adjusting one or more of the operating parameters of the ion source including the rate of supply of the feed gas to the arc chamber of the source, the arc supply power, the cathode power, the extraction voltage and the spacing of the extraction electrodes from the ion source. Appropriate adjustments will be known by the skilled person. Alternatively, beam flux can be adjusted by altering a beam aperture at a selected location along the beam path, so as to reduce the current of beam passing through the aperture.

Alternatively, or as well, the calculated uniformity can be improved by modifying the beam profile. As demonstrated above, if the beam profile is closer to a Gaussian shape, the blending properties of the beam can be substantially improved so that good dose uniformity is obtainable with larger raster line spacings. Retuning of the beam, in ways which are well understood by the workers in this field, can improve the beam profile. Retuning can minimize clipping of the beam as it passes from ion source to process chamber, and thereby remove undesirable asymmetries or peaks in the beam profile. The beam could be retuned, for example, by adjusting the lateral position of ion source extraction electrodes relative to the arc chamber of the source, to ensure the extracted beam is directed centrally along the optimum flight path along the beam line of the implanter. Beam profile may also be modified by introducing a single magnetic quadrupole in the beam line to produce a desired spreading of the beam in the Y-direction.

In this procedure, the beam profile is remeasured and the resulting uniformity using the desired line spacing is recalculated with a view to meeting the required uniformity specification.

Figure 12:
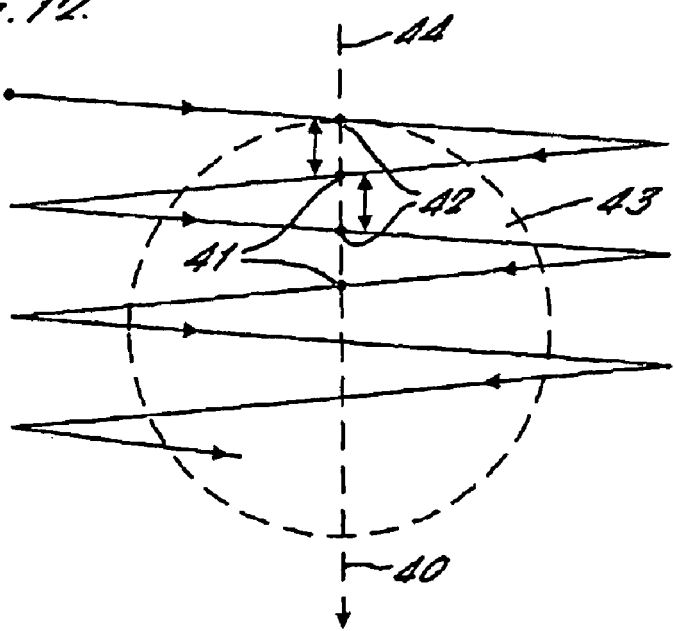
FIG. 12 illustrates a still further scanning pattern.

In the examples of the invention described above, the scanning mechanism is controlled to provide a stepped slow scan, with a uniform step movement between successive fast scans, to produce parallel scan lines on the wafer. In other embodiments of the invention, a continuous slow scan action may be employed with simultaneous fast scans, to produce a zig-zag like scan pattern on the wafer, e.g. as illustrated in FIG. 12. Tolerable dose uniformity in the slow scan direction 40 can still be obtained for example if the mid-points 41, 42 of successive scans are uniformly spaced in the slow scan direction. It can be seen however that dose uniformity is increasingly compromised towards the edges of the wafer 43 on either side of the centre line 44 where the spacing between successive line pairs becomes increasingly different. Nevertheless, if the pitch (between line mid-points) is sufficiently small compared to the beam size in the slow scan direction, adequate uniformity over the whole wafer can be obtained. It is still important to control the slow scan speed relative to the fast scan repetition rate to achieve a line mid-point spacing which is small enough to provide the desired uniformity. Dose uniformity in the slow scan direction can be calculated at locations near the edge of the wafer where uniformity will be most compromised by the zig-zag scan pattern. These calculations can be performed using Fourier transform techniques similar to those discussed above for parallel line scanning. Alternatively, computer simulation techniques may be employed.

In order to ensure good overall uniformity in the slow scan direction, a minimum pitch size (between line mid-points) is determined by calculation from knowledge of the beam profile shape. Then subsequent scanning of the wafer must maintain a pitch size no greater than this calculated minimum.

As with parallel line scanning, it may be necessary to reduce beam current or improve beam profile, to achieve the required minimum pitch size without exceeding the required recipe dose on the wafer.

To compensate for any variation in beam current during a pass, this is measured at turnaround points between successive fast scans and the speed of subsequent fast scans controlled accordingly. The repetition rate of fast scans is preferably maintained constant, so that changes in fast scan speed do not effect the pitch between scan line mid-points. This may require some dead time available at each fast scan turnaround to accommodate the increased fast scan time consequent on a reduced fast scan speed for example.

In the above-described examples, the mechanical system disclosed is based on the structure described in the above-referred International Patent Application WO 03/088303. Any other form of mechanical scanning arrangement may also be used to provide the desired equally spaced and parallel raster lines. For example, the articulated arm scanning mechanism disclosed in United Kingdom Application No. 0214384.0 filed 21 Jun. 2002 may be employed.

Also, the scans of the substrate holder forming the parallel raster lines need not be precisely linear but could, for example, be formed as arcs of concentric circles.

Many other arrangements may be employed for providing the essential features of the invention as set out in the following claims.

The invention claimed is:

1. A method of implanting a substrate wafer having an implant surface with a predetermined diameter, the method comprising:
   a) generating an implant beam having a predetermined beam direction,
   b) holding said substrate wafer aligned in an implant plane, normal to said beam direction,
   c) said beam having orthogonal cross-sectional dimensions in said implant plane each of which is less than said predetermined wafer diameter, and
   d) mechanically scanning said substrate wafer in two dimensions in said implant plane to provide a desired uniform total implant dose over the implant surface of the substrate wafer, said mechanically scanning comprising a first mechanically driven reciprocating movement of the wafer along a first translational direction, and a second mechanically driven reciprocating movement of the wafer along a second translational direction different from said first translational direction,
   wherein said mechanical scanning is performed so as to deliver said total implant dose in first and second parts,
   said first part being delivered by performing said mechanical scanning with said substrate wafer held in a first constant orientation about a twist axis parallel to said predetermined beam direction, and
   said second part being delivered to complete said total implant dose by performing said mechanical scanning with the substrate wafer held in a second constant orientation at 180° to said first orientation about said twist axis.

2. A method as claimed in claim 1, wherein said mechanical scanning is performed so that each of said first and second parts of said total implant dose are delivered evenly over the implant surface of said substrate wafer.

3. A method as claimed in claim 2 wherein said first and second implant dose parts are equal.

4. A method as claimed in claim 1 wherein the substrate wafer is mechanically scanned so that, during delivery of each of said first and second implant dose parts, the implant beam draws on the implant surface of the substrate wafer at least one raster of scan lines.

5. A method as claimed in claim 4, wherein the substrate wafer is mechanically scanned so that the implant beam draws on the implant surface of the substrate wafer successive said rasters with the substrate wafer held for respective said successive rasters alternately in said first and said second orientations.

6. A method as claimed in claim 4, wherein each said raster comprises uniformly spaced parallel scan lines and the scan lines drawn in one said raster of said second implant dose part are interlaced with the scan lines drawn in preceding said raster of said first implant dose part.

7. A method as claimed in claim 6, wherein said rasters of interlaced scan lines have a spatial phasing which is selected to optimize uniformity of the total implant dose.

8. A method as claimed in claim 7, wherein said spatial phasing of said rasters is selected by measuring the intensity profile of the implant beam in said implant plane in a direction transverse to said scan lines and using said beam profile to determine a spatial phasing providing optimum total dose uniformity.

9. A method of implanting a substrate wafer having an implant surface with a predetermined diameter, the method comprising:
   a) generating an implant beam having a predetermined beam direction,
   b) holding said substrate wafer aligned in an implant plane, normal to said beam direction,
   c) said beam having orthogonal cross-sectional dimensions in said implant plane each of which is less than said predetermined wafer diameter, and
   d) mechanically scanning said substrate wafer in two dimensions in said implant plane to provide a desired uniform total implant dose over the implant surface of the substrate wafer, said mechanically scanning comprising a first mechanically driven reciprocating movement of the wafer along a first translational direction, and a second mechanically driven reciprocating movement of the wafer along a second translational direction different from said first translational direction,
   wherein the substrate wafer is mechanically scanned so that the implant beam draws on the implant surface of the substrate wafer alternating first and second rasters of scan lines, each of said first and second rasters covering the whole of said implant surface,
   said first rasters are drawn with said substrate wafer held in a first constant orientation about a twist axis parallel to said predetermined beam direction, and
   said second rasters are drawn with the substrate wafer held in a second constant orientation at 180° to said first orientation about said twist axis.

* * * * *